United States Patent [19]

Welch et al.

[11] Patent Number: 5,864,574
[45] Date of Patent: *Jan. 26, 1999

[54] SEMICONDUCTOR GAIN MEDIUM WITH A LIGHT DIVERGENCE REGION THAT HAS A PATTERNED RESISTIVE REGION

[75] Inventors: David F. Welch, Palo Alto; David G. Mehuys, Menlo Park; Donald R. Scifres, San Jose, all of Calif.

[73] Assignee: SDL, Inc., San Jose, Calif.

[*] Notice: This patent issued on a continued prosecution application filed under 37 CFR 1.53(d), and is subject to the twenty year patent term provisions of 35 U.S.C. 154(a)(2).

The term of this patent shall not extend beyond the expiration date of Pat. No. 5,392,308.

[21] Appl. No.: 624,282

[22] Filed: Mar. 29, 1996

Related U.S. Application Data

[62] Division of Ser. No. 263,190, Jun. 21, 1994, Pat. No. 5,592,503, which is a division of Ser. No. 1,735, Jan. 7, 1993, Pat. No. 5,392,308.

[51] Int. Cl.$^6$ ............................... H01S 3/19; H01S 3/00
[52] U.S. Cl. .............................. 372/50; 372/46; 372/20; 359/344
[58] Field of Search ................ 372/45–50, 20, 372/26, 28, 32, 96, 98, 99, 100, 101, 102; 359/333, 344

[56] References Cited

U.S. PATENT DOCUMENTS

| | | | |
|---|---|---|---|
| 4,251,780 | 2/1981 | Scifres et al. | 372/18 |
| 4,689,797 | 8/1987 | Olshansky | 372/45 |
| 4,744,089 | 5/1988 | Montroll et al. | 372/50 |
| 4,783,788 | 11/1988 | Gordon | 372/45 |
| 4,932,034 | 6/1990 | Usami et al. | 372/96 |
| 4,942,585 | 7/1990 | Ungar | 372/44 |
| 5,060,235 | 10/1991 | Ikeda | 372/45 |
| 5,175,643 | 12/1992 | Andrews | 359/339 |
| 5,233,623 | 8/1993 | Chang | 372/46 |
| 5,260,822 | 11/1993 | Missaggia et al. | 359/337 |
| 5,450,432 | 9/1995 | Okuda | 372/50 |
| 5,450,437 | 9/1995 | Shim et al. | 372/96 |

FOREIGN PATENT DOCUMENTS

| | | | |
|---|---|---|---|
| 2-85293 | 3/1990 | Japan | 372/46 |
| 2-166785 | 6/1990 | Japan | 372/46 |

OTHER PUBLICATIONS

Welch et al, "High power, AlGaAs buried heterostructure lasers with flared waveguides", Appl. Phys. Lett. 50(5), pp. 233–235, Feb. 1987.

Primary Examiner—Hemang Sanghavi
Attorney, Agent, or Firm—W. Douglas Carothers, Jr.

[57] ABSTRACT

A semiconductor gain medium has an active gain region with a partially patterned radiation diverging region. The partially patterned radiation diverging region may be created with spatial resistive regions formed in a portion of the radiation diverging region having a narrower width than in other portions of the diverging region where the propagating radiation has a greater width. The gain region may be an amplifier or, in addition to the amplifier, may include a resonator cavity, or operate as an unstable resonator.

15 Claims, 12 Drawing Sheets

SEMICONDUCTOR GAIN MEDIUM WITH A LIGHT DIVERGENCE REGION THAT HAS A PATTERNED RESISTIVE REGION

This is a division, of application Ser. No. 08/263,190 filed on Jun. 21, 1994, U.S. Pat. No. 5,592,503, which is a division of Ser. No. 08/001,735 filed on Jan. 7, 1993, U.S. Pat. No. 5,392,308.

DESCRIPTION

1. Technical Field

The present invention relates to external-cavity semiconductor lasers, especially to those lasers that include a frequency-selective tuning element for broadband tunability and narrow linewidth light emission. The invention also relates to lasers with single spatial mode, diffraction-limited emission, and to light amplifying diode heterostructures with flared gain regions.

2. Background Art

External-cavity semiconductor lasers, including lasers with frequency selective tuning elements in the cavity, are well known and have been extensively studied. For example, T. Fujita, et al., in *Applied Physics Letters* 51(6), pages 392–394 (1987), describe a laser having a buried heterostructure laser that has been antireflection (AR) coated on the intracavity facet, a collimating lens, a polarization beamsplitter, external cavity mirrors in each of the TE and TM polarization light paths, and an electro-optic modulator in the TE polarization path between the beamsplitter and cavity mirror. The configuration allows selection of either the TE or TM mode of oscillation by adjusting the modulator's bias voltage. W. Sorin, et al., in *Optics Letters* 13(9), pages 731–733 (1988), describe a laser having a laser diode with one of its facets AR coated to reduce its reflectivity, a lens, a single mode optical fiber and a tunable evanescent grating reflector for providing feedback. The laser is wavelength tunable by sliding the feedback grating laterally over the fiber. P. Zorabedian et al., in *Optics Letters* 13(10), pages 826–828 (1988), describe another wavelength tunable laser using either a rotatable interference filter in an external Fabry-Perot cavity or an external grating reflector providing frequency-selective feedback.

A problem with previously available external-cavity semiconductor lasers is their generally low output power (on the order of 10 mW cw and 200–300 mW pulesd). Further, higher output powers are associated with unstable output intensity and frequency and less than good modal quality.

In U.S. Pat. No. 4,251,780, Scifres et al. describe semiconductor injection lasers that are provided with a stripe offset geometry in order to enhance and stabilize operation in the lowest order or fundamental transverse mode. In one configuration, the stripe geometry has a horn shaped or trapezoidal section connected to a straight section, in which the width of the horn shaped or trapezoidal section expands from 8 μm at the straight section to 25 μm at the cleaved end facet. In contrast to configurations in which the edges of the stripe waveguides are linear and orthogonal to the cleaved end facets of the lasers, the nonorthogonal angled or curved edges of the offset stripe geometries cause higher order modes to reflect or radiate out of the waveguide, thereby increasing the threshold of the higher order modes relative to the fundamental mode.

In U.S. Pat. No. 4,815,084, Scifres et al. describe semiconductor lasers and laser arrays in which lenses and other optical elements have been integrated into the semiconductor bodies of the lasers by means of refractive index changes at boundaries in the light guiding region, where the boundaries are characterized by a lateral geometric contour corresponding to surfaces of selected optical elements so as to cause changes in shape of phase fronts of lightwaves propagating across the boundaries in a manner analogous to the change produced by the optical elements. In one embodiment, a biconcave or plano-concave diverging lens element is integrated within the laser in order to counteract the self-focusing that usually occurs in broad area lasers and that can lead to optical filamentation and lateral incoherence across the laser. The diverging lens in the laser allows the laser to operate as an unstable resonator, leading to high output power and good coherence across the lateral wavefront.

An object of the invention is to provide a high power, external cavity, semiconductor laser which emits a single spatial mode, diffraction-limited output beam.

Another object of the invention is to provide a wavelength tunable, high power, external cavity, semiconductor laser with a stable, single frequency, narrow linewidth light output.

DISCLOSURE OF THE INVENTION

The above objects are met with a laser in which a semiconductor active medium is located within an at most marginally stable resonant cavity with a single-spatial-mode filter therein. The semiconductor active medium is preferably an electrically pumped light amplifying diode heterostructure or "amplifier chip" that has a flared gain region with a narrow, single mode, optical aperture end and a broad light output end. The flared gain region permits the light to freely diffract as it propagates in the gain region, so the light has a diverging phase front. Only the central-most light rays of backward propagating light can pass through the narrow aperture end of the flared gain region to reach an external rear reflector of the resonant cavity. Rear reflectors integral with the diode heterostructure could also be used. The rear reflector can be a mirror surface or a frequency selective grating reflector. Orientation of the grating reflector determines which wavelength of light will couple back through the narrow aperture in the amplifier chip into the flared gain region. The flared gain region ensures high power amplification of forward propagating light while maintaining a single spatial mode of oscillation.

The invention also includes related master oscillator power amplifier (MOPA) devices in which a first portion of the above described semiconductor active medium is located within the resonant cavity to form a laser oscillator with external rear reflector, while a second portion of the same active medium is located outside the resonant cavity to form an optical power amplifier that is optically coupled to the laser oscillator.

BRIEF DESCRIPTION OF THE DRAWINGS

FIGS. 18–24A and 24B are top plan views of alternate external cavity lasers of the resent invention.

BEST MODE FOR CARRYING OUT THE INVENTION

Figure 1:
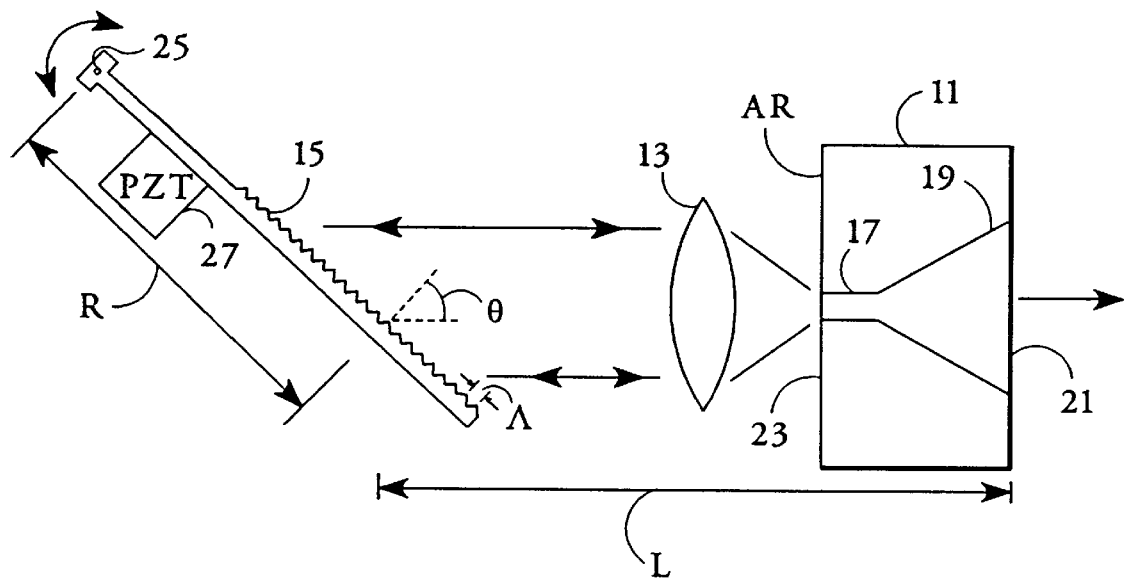
FIG. 1 is a schematic top plan view of a wavelength tunable, external cavity, semiconductor laser of the present invention.

With reference to FIG. 1, an external-cavity semiconductor laser, in accord with one embodiment of the present invention, has an active gain medium that is a light amplifying diode heterostructure or "amplifier chip" 11, and also has a light reflective, external, diffraction grating 15 and a lens 13. The amplifier chip 11 shown in FIG. 1 has a single mode waveguide section 17 incorporated on the grating side of the chip, opening into a flared gain section 19 on the output side of the chip. Preferably, the flared gain region 19 is linearly flared and increases in width toward the front output facet 21 of the amplifier chip 11 at a rate that is slightly greater than the divergence of light propagating within the flared gain region 19. The front output facet 21 is typically coated for low reflection. Though a facet reflectivity of 30% would likely be acceptable, typically the reflectivity of the coated facet 21 is less than 10%, with a 2 to 3% reflectivity being preferred. The rear facet 23 on the grating side of the amplifier chip 11 is antireflection coated in order to suppress self-oscillation of the chip. A reflectivity of 1% or less is preferred.

The lens 13 is a high numerical aperture lens positioned to receive and collimate light emitted from the single-mode waveguide 17 through the antireflection-coated rear facet 23. A spherical lens with a focal length of about 6.5 mm is typical. A graded-index (GRIN) rod lens could also be used. Although a simple single element lens is shown, a more complex lens system to correct for astigmatic and chromatic aberration or other optical phenomena could be used.

The front output facet 21 of the amplifier chip 11 and the external grating 15 form a frequency-selective optical resonator in which diffraction from the reflective grating 15 provides frequency-selective feedback of light into the single mode waveguide section 17 of the amplifier chip 11. The wavelength can be tuned by rotating the grating 15 about a pivot point 25 until an orientation is reached that couples light of the desired wavelength back through the lens 13 and into the single mode waveguide section 17. For first order diffraction, the wavelength $\lambda$ is given by the equation $\lambda = 2\Lambda \sin \theta$, where $\Lambda$ is the grating pitch or tooth spacing and $\theta$ is the angle of light incidence and diffraction with respect to the grating normal, as shown in FIG. 1. A typical diffraction grating for use in the present invention has a line density of about 1200 mm$^{-1}$ ($\Lambda$=833 nm) and has a first-order-diffraction differential efficiency $n_{-1}$ which is greater than 70%. Small rotations of the grating 15 can be done with a piezoelectric transducer 27 or by a mechanical rotor.

Preferably, the axis of rotation of the grating 15, defined by the pivot point 25, will be positioned so that the cavity length is adjusted to compensate for the change in wavelength as tuning takes place, in order to minimize mode hopping. This compensation will occur when $R = L \cos \theta_0 / \tan \theta_0$, where R is the distance along the grating 15 from the pivot point 25 to the optic axis of the cavity, as shown in FIG. 1, $\theta_0$ is the angle of light incidence and diffraction with respect to the grating normal for a grating orientation corresponding to a wavelength $\lambda_0$ near the center of the desired wavelength range, and L is the total optical length of the cavity at that grating orientation. Then, for small changes in orientation ($\Delta\theta$), the wavelength will tune ($\Delta\lambda$) at the same rate as the longitudinal modes of the external cavity ($\Delta L = m \Delta\lambda$, where m is a positive integer). This results in longer continuous tuning ranges, as previously demonstrated by Schremer and Tang in *IEEE Photonics Technology Letters*, Vol. 2, No. 1, January, 1990, pp. 3–5.

In operation, the single mode waveguide section 17 incorporated in the grating side of the amplifier chip 11 acts as a spatial mode filter to enhance single spatial mode oscillation in the laser cavity. Also, in combination with the external grating reflector 15, the narrow aperture of the waveguide section 17 acts to select an extremely narrow frequency band, effectively a single wavelength, for feedback and laser oscillation, since for any given grating orientation, only light of a particular frequency or wavelength will be diffracted back to the precise position on the amplifier chip's rear facet 23 needed to couple into the narrow waveguide section 17 of the amplifier chip 11. Upon exiting the waveguide section 17 into the flared gain section 19, the forward traveling waves of the light beam are allowed to freely diffract as they propagate in the junction plane of the amplifier chip 11, since the flare of the gain section 19 exceeds the divergence of the beam. The light has a diverging phase front in the gain section 19, owing at least in part to the narrow waveguide 17 (Waveguide 17 may be as narrow as 0.5 μm to several micrometers wide to cause significant beam diffraction.), and continues to diverge after reflection from the low reflectivity output facet 21, as seen in the amplifier chip 11 shown in FIG. 6A. Only the central ray 31 returns through the narrow waveguide section 17.

Since the low intensity portion of the light beam diverges in traveling back to the narrow end 29 of the gain section, the narrow end 29 and waveguide 17 act as a spatial filter or aperture to enforce single mode oscillation. Higher order spatial modes experience significantly greater diffraction losses within the optical cavity (in addition to having poorer overlap with the flared gain element 19) and are therefore suppressed to high threshold current levels. The external cavity with flared gain section effectively acts as a resonator with a highly selective spatial filter, which minimizes the net loss of the lowest order mode relative to higher order modes. It is desirable that optical power be output through the low reflectivity facet 21. Alternatively, power output could be obtained by a different order of diffraction off of the grating 15 or by placing a partial beamsplitter in the external cavity.

Figure 2:
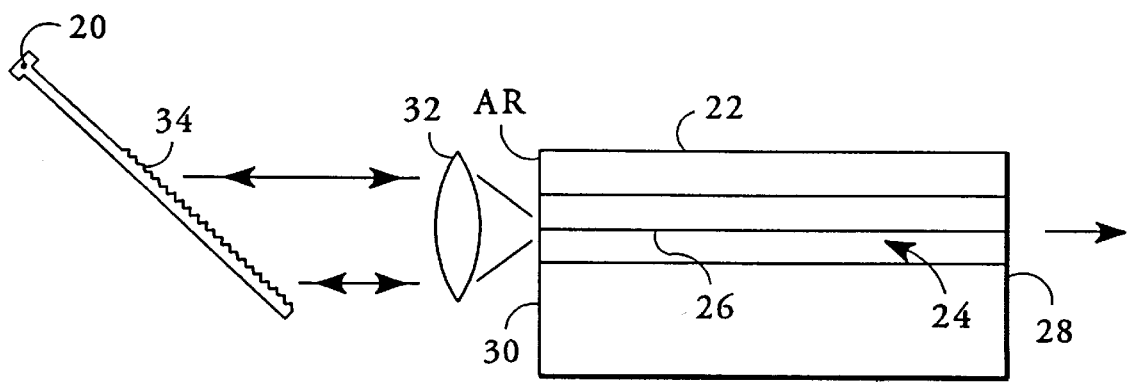
FIG. 2 is a schematic side view of another wavelength tunable, external cavity, semiconductor laser of the present invention.

In FIG. 1, the external rear grating reflector 15 is oriented so that the lines or grooves of the grating, as well as the rotation axis about pivot point 25, are perpendicular to the plane of the pn junction in the diode heterostructure 11. However, such an orientation is not essential. FIG. 2 shows an alternate embodiment in which an external rear grating reflector 34 is oriented so that the lines or grooves of the grating reflector 34 and the rotation axis about the pivot point 20 are parallel to the plane of the pn junction 26 of the diode heterostructure or "amplifier chip" 22. A resonant optical cavity is defined by the grating reflector 34 and a lower reflectivity front facet 28 of the amplifier chip 22. The orientation of the grating reflector 34 selects the narrow wavelength band of light that will resonate in the cavity, since only light of the selected wavelength will be reflected back upon the incident light path and be imaged by the lens 32 onto the AR coated intracavity rear facet 30 of the amplifier chip 22 at a position that will allow it to be recoupled back into the transverse waveguide 24 within the amplifier chip 22. Other wavelengths of light will be diffracted at different angles and so will be imaged by lens 32 either above or below the position of the waveguide 24. The grating orientation shown in FIG. 2 is the more conventional orientation. All figures showing an external grating as a portion of the cavity can be used with the grating orientation of FIGS. 1 or 2.

In FIGS. 1 and 2, the resonant cavity is defined between the external rear grating reflector 15 or 34 and a front facet reflector 21 or 28 of the amplifier chip 11 or 22. Thus, the entire active light amplifying region 17 and 19 or 26 is located within the resonant cavity and the resulting device is a semiconductor laser oscillator providing a coherent light output. Alternatively, referring to FIGS. 3A and 3B, the resonant cavity can be defined between an external rear grating reflector 44 and a distributed Bragg reflector (DBR) grating 38 or a microcleaved or ion milled reflector integrated within the amplifier chip 36. A first, single mode waveguide, portion 40 of the active gain medium is located within the resonant cavity, while a second, flared amplifier, portion 50 of the active gain medium is located outside the resonant cavity. The single mode waveguide section 40, DBR grating 38 and flared amplifier section are monolithically integrated in amplifier chip 36 with two AR coated end facets. The resulting device is a master oscillator power amplifier (MOPA) device in which the external grating reflector 44, a collimating and focusing lens 42, the single mode waveguide section 40 and the DBR grating 38 (or microcleave reflector) form an external cavity laser oscillator and the flared amplifier section 50 of the amplifier chip 36 forms an optical power amplifier optically coupled to the laser oscillator. The flared amplifier section 50 does not provide substantial feedback to the laser oscillator. This device can be wavelength tunable, if the external grating 44 can be angularly rotated and if the DBR grating 38 (or microcleave reflector) has a broadband reflectivity. In the case of use of a DBR grating 38 as a cavity reflector, a lower value of the parameter K·L, where K is the coupling coefficient of the grating to the lightwaves and L is the grating length, is desirable for a wider tuning range. Alternatively, grating 38 may be electrically tuned in wavelength to match the tuning of external reflector 44, or the reflector 44 may be replaced with a plane mirror and the grating 38 used as the only wavelength tuning means.

Figure 3A:
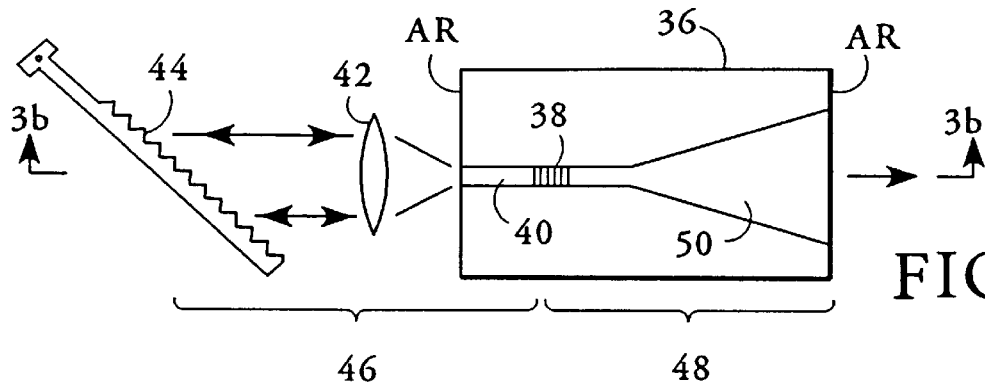
FIGS. 3A and 3B are respective top and side plan views of the wavelength tunable, external cavity, semiconductor MOPA device of the present invention.
Figure 3B:
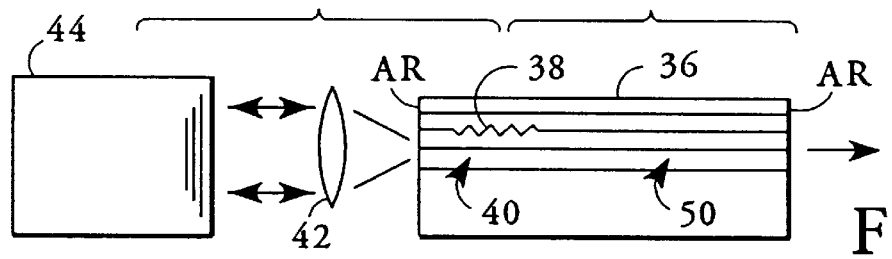
Figure 4:
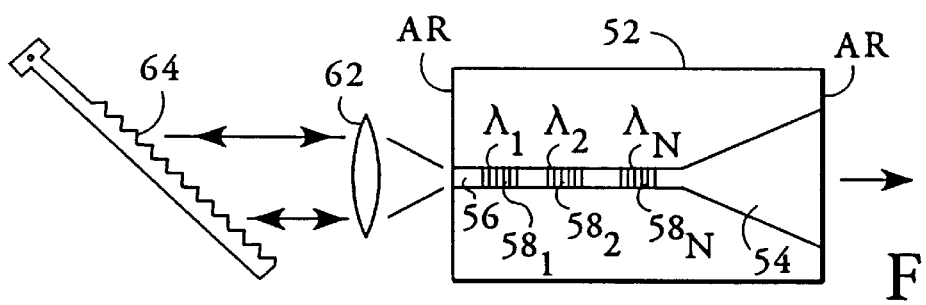
FIG. 4 is a schematic top plan view of a broadband tunable, external cavity, semiconductor MOPA device of the present invention.

With reference to FIG. 4, the amplifier chip 52 may have a series of short DBR grating segments $58_1, 58_2, \ldots, 58_N$ of various grating pitches $\Lambda_1, \Lambda_2, \ldots, \Lambda_N$ between the flared amplifier section 54 and the single mode waveguide section 56 on the chip 52. A resonant optical cavity is defined between in external rear grating reflector 64 and a selected DBR grating segment $58_1, 58_2, \ldots, 58_N$ that depends on the orientation of the external grating reflector 64. Thus, the external grating reflector, a collimating and focusing lens 62, the single mode waveguide section 56 and the selected DBR grating segment $58_1, 58_2, \ldots, 58_N$ form a laser oscillator, which is coupled to a flared optical power amplifier 54 to form a broadband tunable MOPA device. Whereas the tunability of the MOPA device shown in FIGS. 3A and 3B is limited to a relatively narrow range of wavelengths corresponding to the narrow reflection band of the single DBR grating 38, the MOPA device in FIG. 4 can be tuned over a broader wavelength range corresponding to the stepwise-continuous reflection bands $\lambda_1 \pm \Delta\lambda_1, \lambda_2 \pm \Delta\lambda_2, \ldots, \lambda_N \pm \Delta\lambda_N$ of the DBR grating segments $58_1, 58_2, \ldots, 58_N$ and limited only by the gain band of the diode heterostructure 52.

Figure 5:
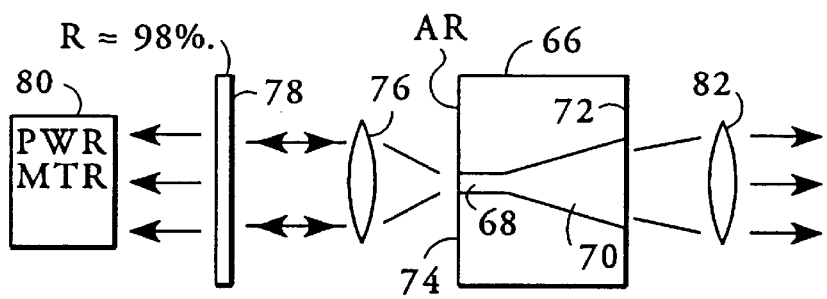
FIG. 5 is a schematic top plan view of yet another external cavity semiconductor laser embodiment of the present invention.

With reference to FIG. 5, an external cavity diode laser has an amplifier chip 66 with a single mode waveguide section 68 coupled to a flared gain section 70. The resonant cavity is defined between an external rear reflector 78, here a highly reflective (R≈98%) planar mirror surface, and a front facet 72 of the amplifier chip 66. Rear facet 74 of the amplifier chip 66 is low reflectivity or antireflection (AR) coated. A lens 76 collimates light emitted from the single mode waveguide 68 through rear facet 74 and focuses reflected light back into the waveguide 68. In this embodiment, an optical power monitor 80, such as a silicon photodetector, could be placed behind the mirror surface 78 to receive the small amount of light transmitted through the mirror surface 78 for monitoring the power level. The detected power level could then be used to control the pump current applied to amplifier chip 66 in order to maintain relatively stable output powers. Monitoring could also be used to verify amplitude modulation. A lens system 82 may be placed in the path of the output beam in front of front facet 72 to collimate the output beam. Because of the different lightwave beam waist positions in the lateral and vertical directions, a cylindrical lens system may be required.

Figure 6A:
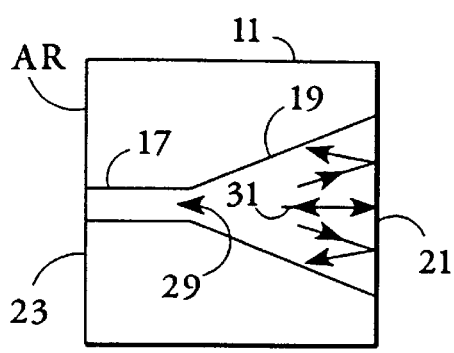
FIGS. 6A–6H are top plan views of eight possible light amplifying diode heterostructures or "amplifier chips" for use in the laser and MOPA embodiments of FIGS. 1–5.
Figure 6B:
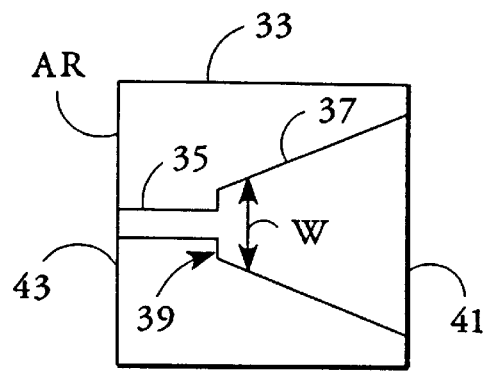
Figure 6C:
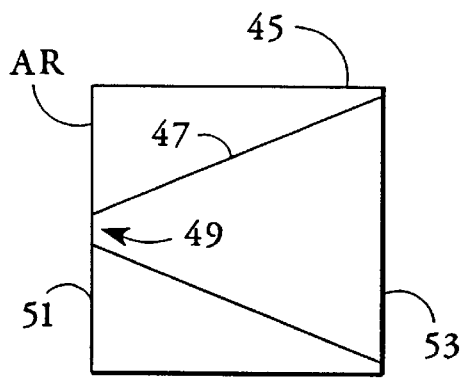

In FIGS. 6A–6H, eight possible amplifier chip embodiments for use in the external-cavity configuration shown in FIGS. 1–5 are depicted. The amplifier chip 11 seen in FIG. 6A is the same as that shown in FIG. 1 and has a single mode waveguide section 17, at a rear end of the chip 11, followed by a flared gain section 19 at a front, output, end of the chip 11. The amplifier chip 11 has an antireflection coated or nearly-AR coated rear facet 23 and a low reflectivity front facet 21. The width of the narrow end of the gain section 19 is the same as the width of the waveguide 17. In FIG. 6B, an amplifier chip 33 also has a single mode waveguide section 35 and a flared gain section 37. However, the narrow end 39 of the gain section 37 has a width W which is not equal to the width of the waveguide 35, but is instead wider than the waveguide section 35. As in the amplifier chip 11 in FIG. 6A, the gain region 37 of amplifier 33 is preferably linearly flared and increases at a constant rate that is slightly greater than the divergence of light propagating in the gain region 37. However, gain sections with nonlinear flares, i.e. having increases in width that are not at a constant rate across the length of the gain section 37 or broad area gain sections, could also be used. The amplifier chip 33 has an antireflection coated rear facet 43 and a low reflectivity front output facet 41. In FIG. 6C, another amplifier chip 45 has only a flared gain region 47 and no single mode waveguide section. The flared gain region 47 has a narrow aperture end 49 at the antireflection coated rear facet 51 and a broader output end at low reflectivity front output facet 53. The flared gain regions 19, 37 and 47 in FIGS. 6A–C increase the optical output power while maintaining a single spatial mode. Typically, 5 mW cw power at the narrow input end 29, 39 and 49 of the gain regions are increased over a length of 100 μm or more to greater than 1 W cw output power at the output facets 21, 41 and 53. The flared amplifier configuration maximizes efficiency by expanding the gain volume along the length of the amplifier as the optical power grows, so that near uniform power density and saturated carrier density are maintained throughout the gain region.

Figure 6D:
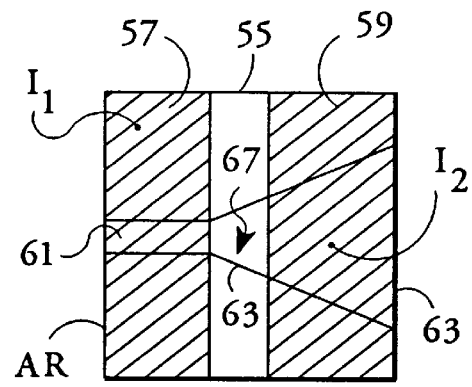

In FIG. 6D, an amplifier chip 55 has separate conductive contacts 57 and 59 for the single mode waveguide 61 and flared gain section 63. Each section 61 and 63 can thus be pumped independently with separate electrical currents $I_1$ and $I_2$. One use of such a configuration is for intensity modulation of the laser. As a result of the individual contacts 57 and 59, the output power emitted through low reflectivity output facet 65 can be modulated by simply modulating the pump current $I_1$ supplied to the single mode waveguide section 61, instead of trying to modulate a single larger pump current provided to the entire amplifier chip. Higher speed modulation and lower modulation current requirements are thus achieved with this amplifier chip configuration. The independently pumped single mode waveguide section 61 might also be used as a preamplifier to bring the optical power coupled into it from the feedback grating 15 up to saturation levels before the light enters the flared gain section 63. Also, the single mode waveguide section 61 could be used as a phase-control section in which the amount of current $I_1$ injected into the phase control waveguide section 61 is adjusted to vary the refractive index in the waveguide and thereby effectively control the total optical length of the cavity to minimize mode hopping and extend the tuning range. Such a technique is described by M. Notomi et al. in *IEEE Photonics Technology Letters*, Vol. 2, No. 2, pages 85–87 (1990). More than two separate contacts might also be present on the amplifier chip. For example, the flared gain section 63 could be differentially pumped with a lower current density provided by one conductive contact to the input end 67 of the flared gain section 63 and a higher current density provided by another conductive contact closer to the output end of the gain section 63 near facet 65. Such differential pumping will reduce noise in the optical output signal. Differential pumping with a lower current density in region 67 versus other portions of the flared gain section 63 will also increase the diffraction-limited output power significantly over that obtained from a uniformly pumped flared region 63.

Figure 6E:
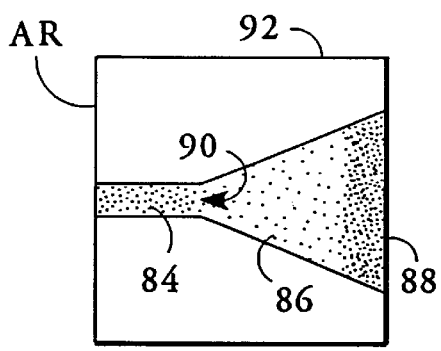

Referring to FIG. 6E, differential pumping of an amplifier chip 92 may also be achieved by means of a selective proton implantation in the gain regions 84 and 86 during fabrication of the chip 92. The varying densities of implanted proton sites in the surface of the amplifier chip 92 cause varying resistivities to electric current over the length of the gain regions 84 and 86. As a result, a uniform bias voltage applied to the gain regions 84 and 86 will produce a current density distribution that varies in different areas of those gain regions 84 and 86, producing differential pumping. In the particular embodiment shown in FIG. 6E, the density of stipling in the drawing represents the surface conductivity in a particular area of the illustrated amplifier chip 92. Thus it can be seen that the rear portion of the flared gain section 86 nearest the narrow aperture 90 connecting the flared gain section 86 to the waveguide section 84 has a lower surface conductivity, and thus is pumped with a lower current density, than the broad front portion of the flared gain region 86 nearest the low reflectivity front output facet 88 of the amplifier chip 92. The single-mode waveguide section 84 could have a conductivity which is like the front portion of the flared gain region 86 or intermediate or equal or higher in value between the high and low conductivity front and rear portions of the flared gain section 86. Regions near facets 88 and 89 may be left unpumped to ensure long life at high power, such as in a window laser formed by quantum size effects, impurity induced disordering, doping, composition change or other means.

Figure 32:
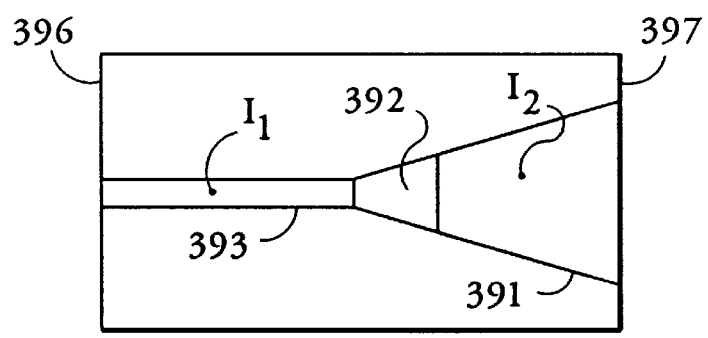

With reference to FIG. 32, differential pumping can also be done using an unpumped transparent region 392 as one of the segments of the differentially pumped flared region 391. This represents the extreme case in which the pump current density is zero in a first portion 392 of the flared region 391. The unpumped transparent region 392 allows the beam to diverge without forming filaments. Transparency can be achieved for zero current density by means of quantum size effects, impurity induced disordering, doping, composition change or other means. The transparent region 392 should be proximate to the single mode light aperture region 393. The end facets 396 and 397 can be AR coated or low reflectivity coated for a flared optical power amplifier, or HR coated and low reflectivity coated (about 5% reflectivity) for a flared laser oscillator. Further, if an internal reflector, such as a DBR grating, is formed, the device with transparent unpumped region 392 in the flared region 391 could form a MOPA device.

Figure 6F:
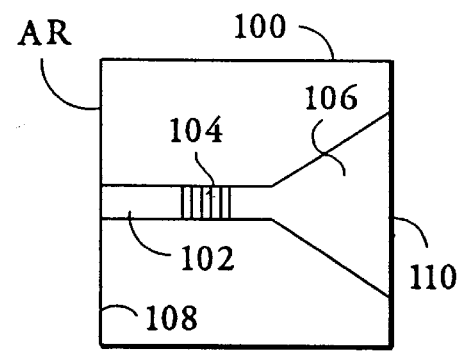

With reference to FIG. 6F, the amplifier chip 100 is essentially that used in the MOPA device of FIGS. 3A and 3B. The amplifier chip 100 includes a single mode waveguide section 102 terminating in a DBR grating 104 and followed by a flared amplifier section 106. End facets 108 and 110 of the chip 100 are antireflection coated.

Figure 6G:
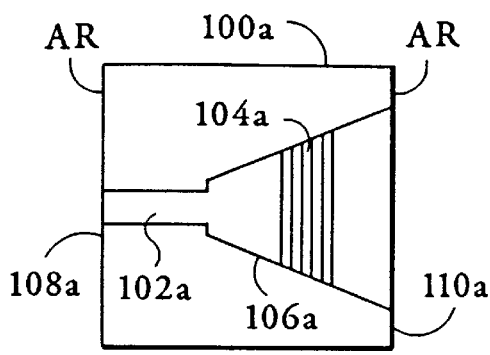

In FIG. 6G, the amplifier chip 100a also includes a single mode waveguide section 102a followed by a flared section 106a, and AR coated or low reflectivity facets 108a and 110a. However, here the DBR grating 104a is located in the flared section 106a. In a configuration like that shown in FIGS. 3A and 3B, the laser oscillator will include the portion of the flared section 106a that is located between the single mode waveguide section 102a and the DBR grating 104a, while the optical power amplifier comprises the remaining portion of flared section 106a between the DBR grating 104a and end facet 110a. The internal reflector 104a could also be an etched mirror.

Figure 6H:
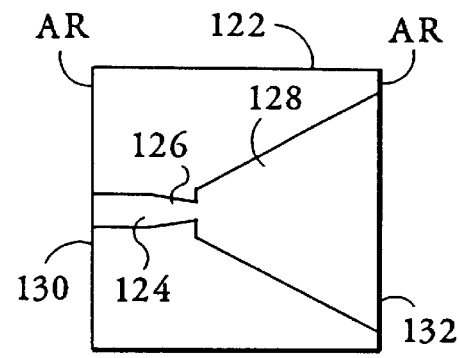

With reference to FIG. 6H, the amplifier chip 122 has a single mode waveguide 124 that tapers in a section 126 to a smaller aperture leading into the flared amplifier section 128 to increase the beam divergence in the flared region 128. As in previous embodiments, end facets 130 and 132 are coated for low reflectivity.

All of the amplifier chips 11, 33, 45, 55, 92, 100, 100a and 122 in FIGS. 6A–6H are light amplifying diode heterostructures with their front and rear facets suitably coated to prevent self-oscillation. Only when at least one external reflector, such as the grating 15 in FIG. 1, is provided to help establish a resonant optical cavity will laser oscillation occur. Alternatively, if the rear facets of each of these devices is HR coated devices 11, 33, 45, 55, 88, 92, 100a, and 122 can form unstable resonator lasers which are stable to high coherent power levels and do not rely on an external reflector. Tunable gratings replacing either reflector can result in broadband wavelength tuning of such a monolithic device. Various heterostructure material compositions, such as GaAs/AlGaAs, InGaAs/AlGaAs, InP/InGaAsP and the like, could be used. Likewise, various known strained, graded index and lattice matched structures, as well as various known current, carrier and optical confinement structures, including single and multiple quantum well structures, may be used. In the case of frequency tunable lasers, such as the grating tuned laser in FIG. 1, it is desirable to tailor the gain of the amplifier chip so that it remains somewhat constant over a wide wavelength range. Such a light amplifying diode heterostructure exhibiting a broadband gain-flattened spectrum can be achieved in single quantum well structures at high pump current densities, as described by M. Mittelstein, et al. in *Applied Physics Letters*, 54(12), pp. 1092–1094 (1989). The amplifier chip's active region can be optimized for use in external cavities like that shown in FIG. 1 by reducing the optical confinement $\Gamma$ in the transverse direction perpendicular to the pn junction of the chip in order to reduce the transverse or vertical divergence of light emitted from front and rear facets. In this way, the coupling efficiency of external optical elements is increased. A further advantage of a lower optical confinement $\Gamma$ is that lensing associated with charge variations and gain saturation is reduced.

Figure 7:
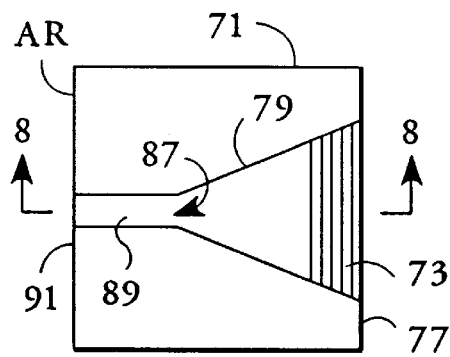
FIG. 7 is a top plan view of yet another amplifier chip for use in the laser and MOPA embodiments of FIGS. 1–5.
Figure 8:
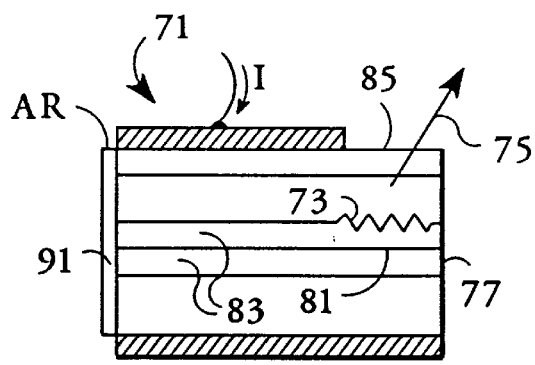
FIG. 8 is a side sectional view taken along the line 8—8 in FIG. 7.

With reference to FIGS. 7 and 8, the amplifier chip 71 may have a detuned grating output coupler 73 integrated therein for providing surface emission 75 of the laser output, rather than end emission from a front facet 77. The detuned grating is located adjacent to the front facet 77 at an end of the flared gain section 79 of the amplifier chip 71 so that the amplified light propagating in the waveguide defined by the active region 81 and cladding layers 83 is coupled by the grating 73 vertically out of the waveguide and through a top (or bottom) surface 85 of the amplifier chip 71. The narrow aperture end 87 of the flared gain section 79 at the rear end thereof is optically coupled to an antireflection (AR) coated near facet 91, preferably, but not necessarily, via a single mode waveguide section 89. The overall effective reflectivity of the grating 73, front facet 77 and output surface 85, taken together, is generally low, i.e. less than about 30%, and typically less than about 10%. One result of the grating coupled surface emission 75 from the amplifier chip 71, when used in a frequency selective external cavity like that shown in FIG. 1, is that the output beam direction is longitudinally steered, forward or backward, as the frequency is tuned, due to the wavelength dependent nature of the diffraction angle of the grating output coupler 73. Alternatively, front facet 77 may be AR coated and grating 73 may be a tuned grating to provide feedback. In this case, the planar mirror external cavity configuration of FIG. 5 is probably preferable and grating 73 may be wavelength tunable.

Figure 9:
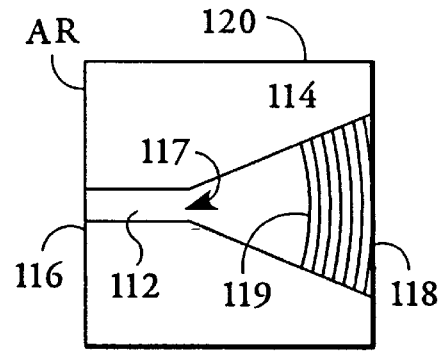
FIG. 9 is a top plan view of still another amplifier chip for use in the laser and MOPA embodiments of FIGS. 1–5.

With reference to FIG. 9, an amplifier chip 120 with a single mode waveguide section 112 and a flared gain section 114 located between a pair of parallel planar end facets 116 and 118, of which facet 116 is antireflection coated, has a curved grating output coupled 119 at the broad end of the flared gain section 114, instead of the straight grating 73 of FIGS. 7 and 8. Light emerging from the waveguide 112 at the narrow aperture 117 freely diffracts in the flared gain section 114 as a divergent beam. The divergent beam is characterized by curved phase fronts. The grating output coupler 119 is a detuned surface emitting grating, like the grating 73 in FIGS. 7 and 8, but has a curvature that matches the curved phase fronts of the lightwaves propagating in the flared gain section 114. The light emerges through a top or bottom surface of the amplifier chip 120 as a substantially collimated beam. Single spatial mode filtering by the aperture 117 of the reflected light returning to the waveguide 112 works best if the back reflectivity of the curved grating 119 is minimized and made substantially less than the low reflectivity of the planar front facet 118.

Figure 10:
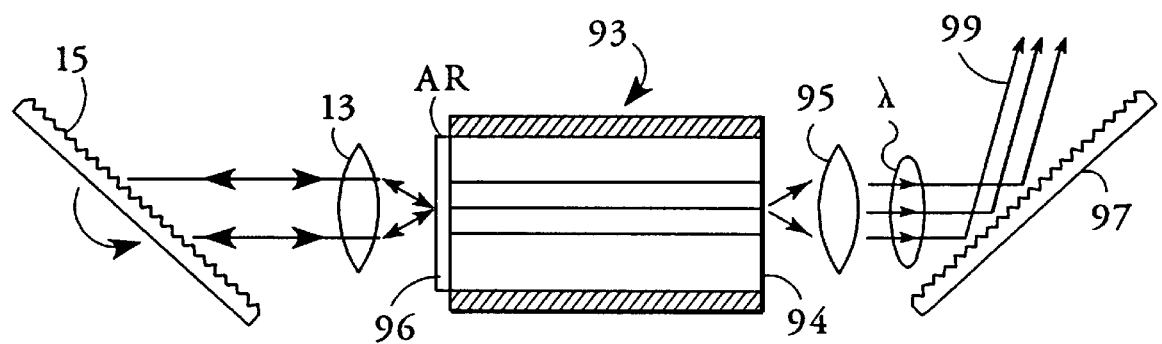
FIG. 10 is a side view of an alternate external cavity semiconductor laser of the present invention with vertical output.

Alternatively, an angled external front grating reflector 97, receiving light emitted through a front end facet 94 of an amplifier chip 93 with a flared gain region, may be used instead of the integral detuned grating 73 in FIGS. 7–9 to redirect the light into a vertical or transverse direction, as shown in FIG. 10. If the amplifier chip 93 is positioned within a frequency selective external cavity having a lens 13 and an external rear grating reflector 15, as shown in FIG. 10, then the external front grating reflector, outside of the laser cavity defined by the grating 15 and facet 94, will also steer the direction of the reflected beam 99 longitudinally, that is, forward and backward, as the wavelength of the emitted light is tuned by the orientation of rear grating 15. A collimating lens or lens system 95 may be placed between the front facet 94 of the amplifier chip 93 and the external front grating reflector 97, so that the emitted light received by the front grating 97 has the same angle of incidence upon the grating 97, regardless of the position of incidence of individual light rays. Alternatively, the grating reflector 97 could be curved to receive the diverging light directly from the emitting facet 94 and reflect it in a collimated beam 99. If longitudinal steering of the beam 99 as the wavelength is tuned is not needed or desired, an angled planar or concave mirror could be used in place of the front grating reflector 97 to simply redirect (or both redirect and collimate) the light output.

Figure 11:
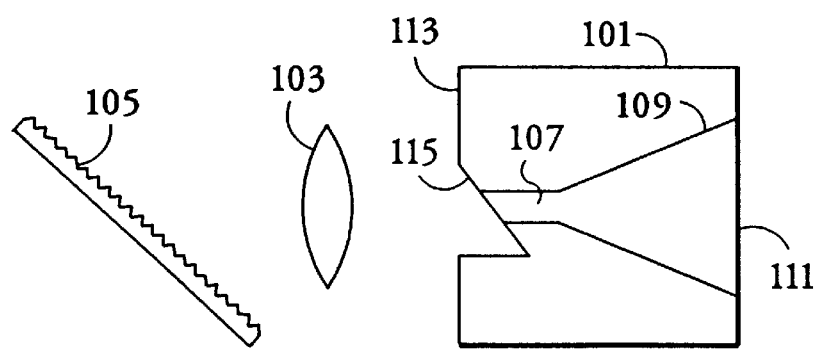
FIG. 11 is a top plan view of another external cavity semiconductor laser embodiment of the present invention.

With reference to FIG. 11, an amplifier chip 101 is positioned in an external cavity having a lens 103 and an external rear grating reflector 105. The amplifier chip 101 itself has a single mode waveguide section 107 followed by a flared gain section 109. The front facet 111 of the amplifier chip 101 has low reflectivity, establishing a resonant cavity with the rear grating reflector 105. In this embodiment, the back facet 113 of the amplifier chip 101 is formed with a Brewster angle surface 115 at least at the aperture of the single mode waveguide section 107. The Brewster angle surface 115 can be formed by ion beam milling and may be oriented, as shown, with the normal or perpendicular to the surface 115 parallel to the pn junction of the amplifier chip 101. Alternatively, the normal to surface 115 could be perpendicular to the pn junction. The orientation in which the Brewster angle surface 115 is formed determines whether the TE or TM polarization mode of oscillation is supported by the cavity. The Brewster surface 115 also increases the continuous tuning capabilities of the external cavity by directing any light reflected by the surface 115 out of the single mode waveguide 107, thereby effectively minimizing back facet reflectivity and pre- venting self-oscillation of the amplifier chip 101. The facet 113 and Brewster surface 115 might additionally be antireflection coated.

Figure 12:
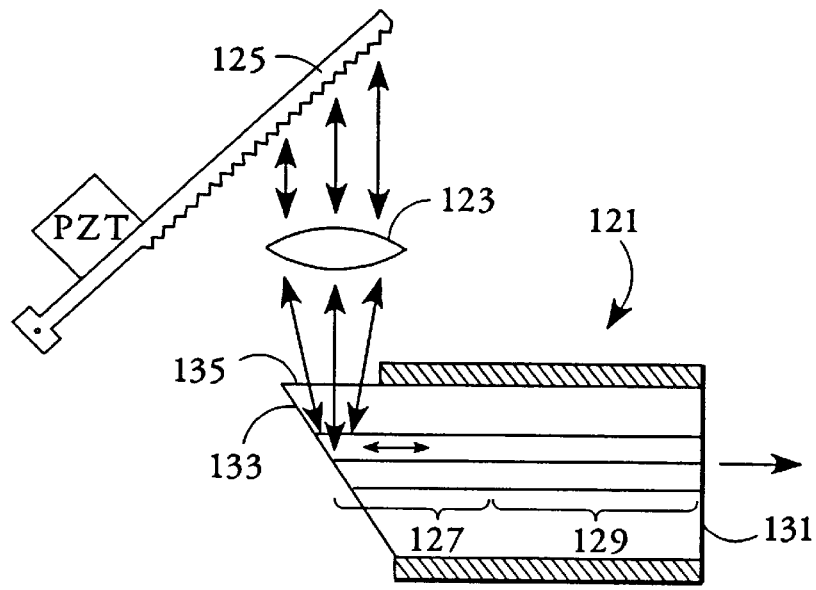
FIG. 12 is a side view of yet another external cavity semiconductor laser of the present invention.

With reference to FIG. 12, another amplifier chip 121, located in an external cavity with a lens 123 and external grating reflector 125, has a single mode waveguide section 127 and a flared gain section 129 as in any of FIGS. 6A–6H and 7. A front end output facet 131 is of low reflectivity and defines a resonant cavity along with the external grating reflector 125. The orientation of the grating 125 can be adjusted to select the frequency of laser oscillation. The amplifier chip 121 also has a back facet 133 that is tilted at an angle, typically about 45°, sufficient to cause it to be totally internally reflecting of backward propagating light in the waveguide and also of light fed back by grating reflector 125 and focused by lens 123 onto the facet 133 in the neighborhood of the single mode waveguide section 127. Light is thus coupled vertically through a substantially nonreflective top (or bottom) amplifier chip surface 135. Surface 135 can be AR coated also. Use of the totally internally reflecting angled back facet 133 minimizes self-oscillation, because backward propagating light from the waveguide section 127 is reflected vertically out of the waveguide and allowed to freely diffract in the amplifier chip 121 before reaching the output surface 135. Any light reflected by the substantially nonreflective output surface 135 has little chance of being coupled back into the waveguide section 127.

Figure 13:
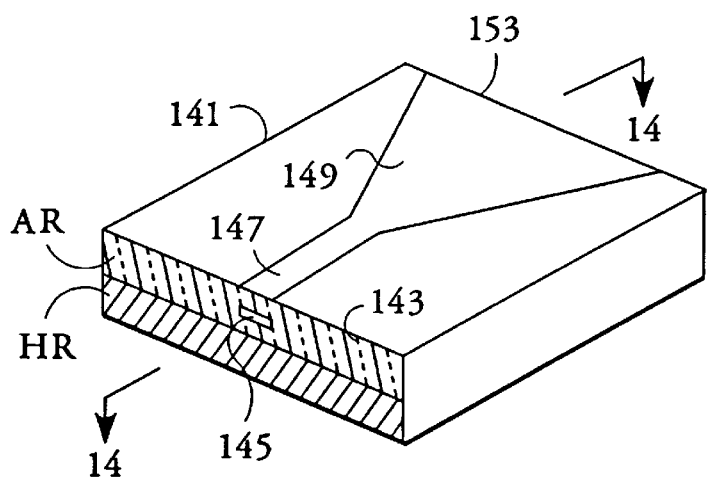
FIG. 13 is a perspective view of an alternative amplifier chip for use in lasers of the present invention.
Figure 14:
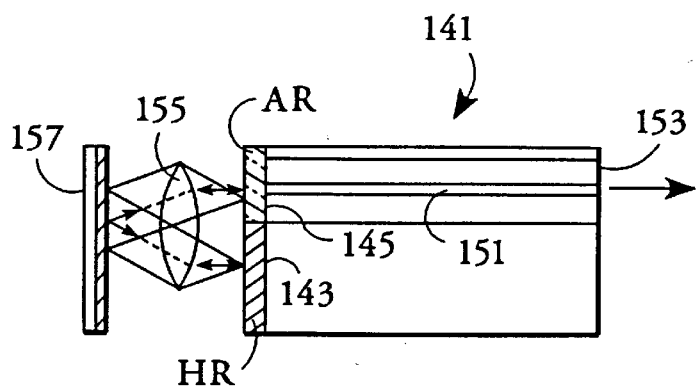
FIG. 14 is a side schematic view of an external cavity laser using the amplifier chip of FIG. 13.

With reference to FIGS. 13 and 14, in order to reduce the alignment sensitivity of the external cavity laser, the back facet 143 of the amplifier chip 141 can be coated such that a top portion of the facet 143, including the light emitting aperture 145, is antireflective, while a bottom portion of the facet 143 is highly reflective. The amplifier chip 141 is otherwise like any of those shown in FIGS. 6A–H, with an optional single mode waveguide section 147 and with a flared gain section 149 in which light propagates in a waveguide 151 and is amplified. The front light emitting end facet 153 has low reflectivity and forms, along with an external rear reflector 157, an external resonant cavity. Rear reflector 157 can be a planar mirror or a grating reflector. A lens 155 is positioned between the rear facet 143 of the amplifier chip 141 and the external rear reflector 157 to collimate the light emitted from the narrow waveguide section 147 through the aperture 145 and to bend the light path slightly downward. This light is reflected by the rear reflector 157 back toward the lens 155, which then focuses the light onto the HR coated bottom portion of rear facet 143. The light is then reflected from the HR coating back toward the lens 155, where it is collimated and bent onto a slightly upward return path. Being reflected a second time from the external rear reflector 157, the light is finally focussed by the lens 155 back onto the aperture 145 and coupled into the waveguide 147. In this way, difficult alignment tolerances in the direction perpendicular to the pn junction are reduced, because the vertical alignment of the amplifier chip 141 with the lens 155 and external rear reflector 157 only determines the amount of light path bending by the lens 155, and does not adversely affect the coupling of light back through the aperture 145. In place of the lens 155 and planar rear reflector 157, a suitably curved external rear reflector could be used, as described in U.S. Pat. No. 4,797,894 to Yaeli. In the case where the external rear reflector 157 is a frequency selective grating reflector, as seen in FIG. 1, the reflection of light twice off of the rear reflector 157 provides an additional advantage. Due to two pass operation of the grating reflector 157, the spectral line width of the light coupled back into the aperture 145 is reduced substantially.

Figure 15:
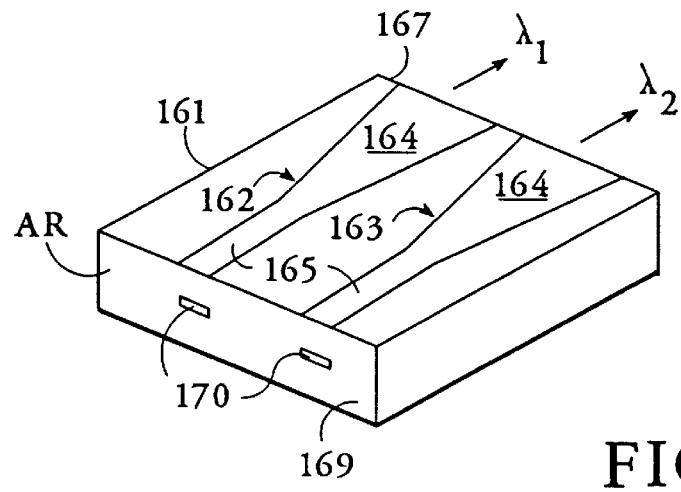
FIG. 15 is a perspective view of a monolithic array amplifier chip of the present invention.
Figure 16:
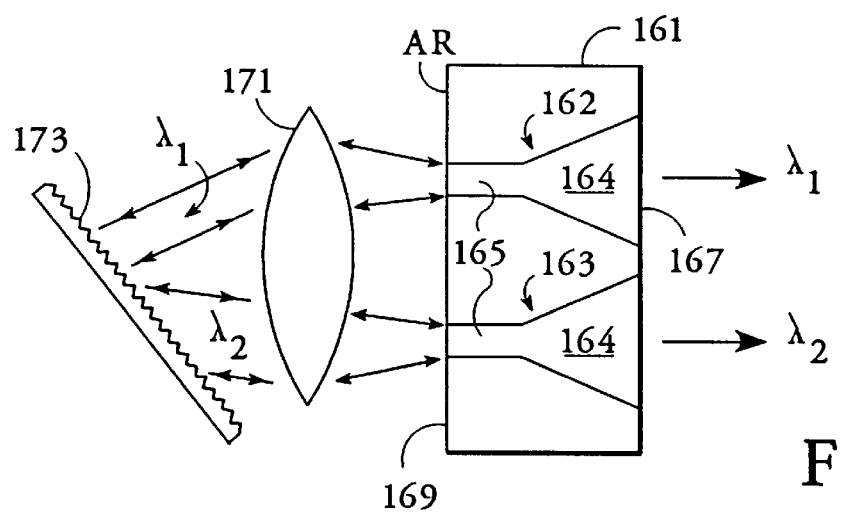
FIG. 16 is a top plan view of a laser array using the amplifier chip of FIG. 15.

With reference to FIGS. 15 and 16, an amplifier chip 161 may have a monolithic array of sources 162, 163, etc. for simultaneous operation in multiple wavelengths $\lambda_1$, $\lambda_2$, etc. Each source 162, 163, etc. on the amplifier chip 161 is constructed, as in FIGS. 6A–H and 7, with a flared gain section 164 and a spatial mode filter, such as a single mode waveguide section 165, at the narrow end of the flared gain section 164. The front output facet 167 at the broad end of the flared gain section 164 is characterized by low reflectivity and forms, together with an external rear grating reflector 173, a resonant cavity for laser operation. The rear end facet 169 is antireflection (AR) coated to prevent self-oscillation of the amplifier chip 161. The flared gain regions 164 of each source 162, 163, etc. in the array can be fabricated to amplify at different emission wavelengths. This is done, for example, by using a single quantum well strained layer InGaAs/InAlGaAs laser, where the gain band may be 50 nm wide. In order to make the single monolithic amplifier chip 161 capable of operating over a large wavelength range (e.g. 630 nm to 1100 nm) with each array element 162, 163, etc. operating over about a 50 nm bandwidth, the multiwavelength amplifier array can be fabricated as described for laser arrays in U.S. Pat. Nos. 4,925,811, 4,955,030 and 5,039,627 to Menigaux et al. These laser array structures have stacks of alternate confinement layers and active layers, with each active layer being of a different composition from the others and being characterized by a different gain wavelength. PN junctions are formed in the vicinity of different active layers in the stack by means of localized introduction and diffusion of a p-type impurity to different depths. An alternative way to form a multiwavelength amplifier array is to use multiple amplifier chips, each having a different amplifying wavelength. In either case, light beams emitted through the apertures 170 of the multiple sources 162, 163, etc. at the AR coated rear facet 169 are collimated by a lens 171 and reflected from the external grating reflector 173 back through the lens 171 to be focussed on the rear facet 169. The relative positions of the apertures 170 with respect to the lens 171 determine the amount of bending of the light paths for the various emitted beams, and therefore determine the different incidence angles of each beam on the grating 173. Only light of particular wavelengths $\lambda_1$, $\lambda_2$, etc. corresponding to the respective incidence angles are coupled back through the apertures 170 into the amplifier chip 161. Thus, each source 162, 163, etc. located in the external cavity will only oscillate at a particular wavelength $\lambda_1$, $\lambda_2$, etc. corresponding to the incidence angle of light from that source onto the grating 173. The gain band of the active medium for each source 162, 163, etc. should be selected to match its resonance band in the cavity. A Fabry-Perot external mirror could be used in place of grating reflector 173.

Figure 17:
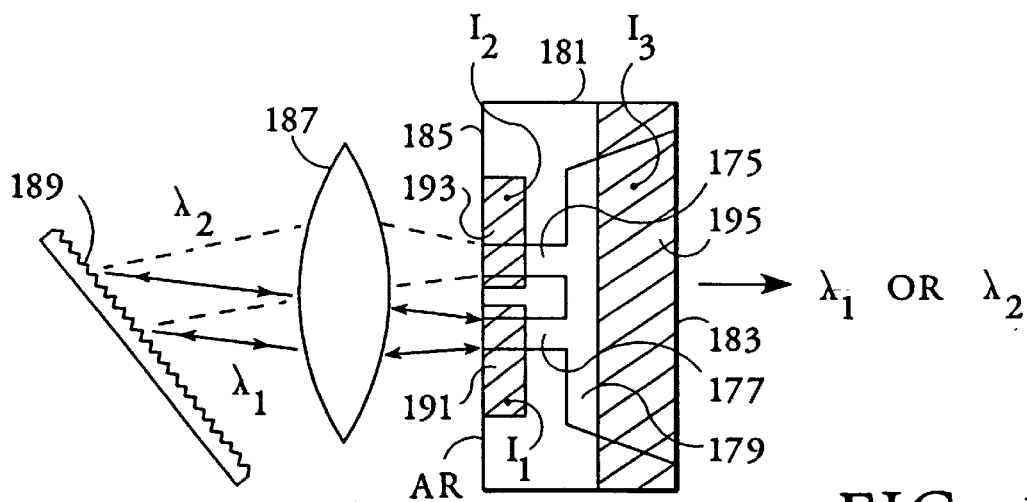
FIG. 17 is a top plan view of a frequency switchable laser embodiment of the resent invention.

With reference to FIG. 17, several single mode waveguide regions 175 and 177 may be coupled to a single flared gain region 179 on an amplifier chip 181 for providing a wavelength switching capability. As in FIG. 16, the amplifier chip 181 has a front light emitting facet 183 that is of low reflectivity and that forms, along with external rear grating reflector 189, a resonant cavity for laser oscillation. Rear facet 185 of the amplifier chip 181 is antireflection coated. A lens 187 is positioned between the rear facet 185 and the grating reflector 189. As in FIG. 16, the difference in position of the light emitting waveguide apertures 175 and 177 at rear facet 185 relative to the lens 187 results in a difference in incidence angle of the light beams upon the grating 189 and thus a difference in the wavelength $\lambda_1$ or $\lambda_2$ that can oscillate. The waveguides 175 and 177 should be spaced sufficiently far apart to minimize crosstalk, but sufficiently close that both wavelengths $\lambda_1$ and $\lambda_2$ fall within the gain spectrum of the common flared gain region 179. Separate electrical contacts 191 and 193 independently bias the waveguides 175 and 177 and independently inject current $I_1$ and $I_2$ into the respective waveguides. At least one other conductive contact 195 provides current $I_3$ to the flared gain region 179. Biasing only one of the waveguides 175 and 177 so as to minimize loss in the selected waveguide will select the wavelength $\lambda_1$, $\lambda_2$ of the output beam. Alternatively, operating both waveguides 175 and 177 would lead to simultaneous multiple wavelength operation, as well as the generation of harmonics of the wavelengths $\lambda_1$ and $\lambda_2$.

Figure 18:
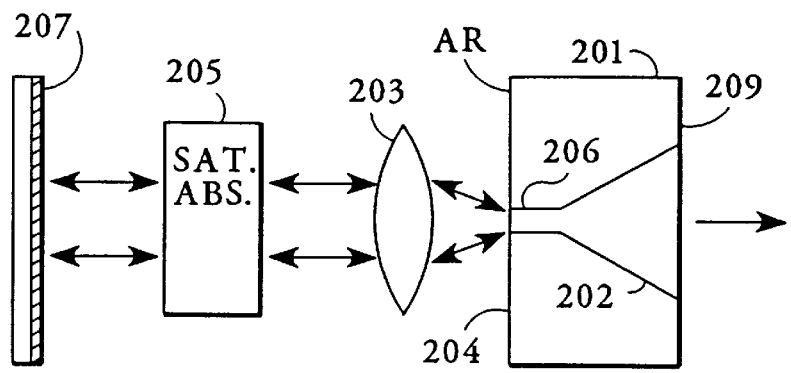

With reference to FIGS. 18–28, other cavity configurations using one of the above described amplifier chips with flared gain region are possible. For example, a saturable absorber 205 can be incorporated into the external cavity to act as a Q-switch for generating short pulses, as seen in FIG. 18. An amplifier chip 201 having a flared gain region 202 is placed within a resonant cavity defined by a low reflectivity front end facet 209 of the amplifier chip 201 and an external rear reflector 207. Rear reflector 207 may be a mirror surface or a grating reflector. A lens 203 and the saturable absorber 205 are positioned between an AR coated rear facet 204 of the amplifier chip 201 and the rear reflector 207. Lens 203 receives light emitted from the narrow aperture end of the flared gain region 202 through AR coated rear facet 204 and collimates the light beam for passage through saturable absorber 205 to the rear reflector 207. Lens 203 also receives the return light reflected from the rear reflector 207 back through saturable absorber 205 and focuses the light onto the rear facet 204 for coupling through the narrow aperture into the flared gain region 202 of the amplifier chip 201. The cavity configuration provides for mode locked, high average and peak power operation of laser in a pulsed mode. A saturable absorber formed by an unpumped or reverse biased region in the chip along the length of the cavity can also provide mode locked operation. Synchronous pumping of at least a portion of flared gain region 202 or single mode gain region 206 at a period coinciding with the round trip transit time of light pulses in the cavity also results in picosecond pulse lengths and very high peak power outputs. The effectively unstable resonant cavity provided in part by the flared gain region 202 together with narrow, single mode, aperture 206 ensures stable, single mode operation even at high power.

Figure 19:
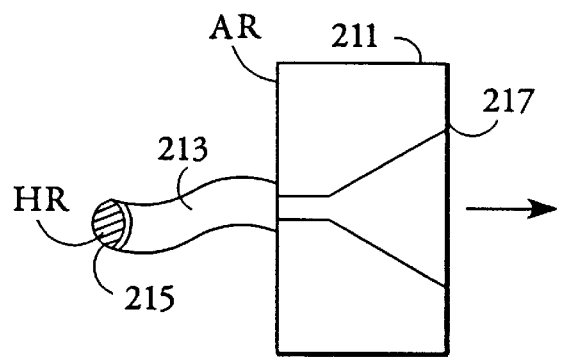
Figure 20:
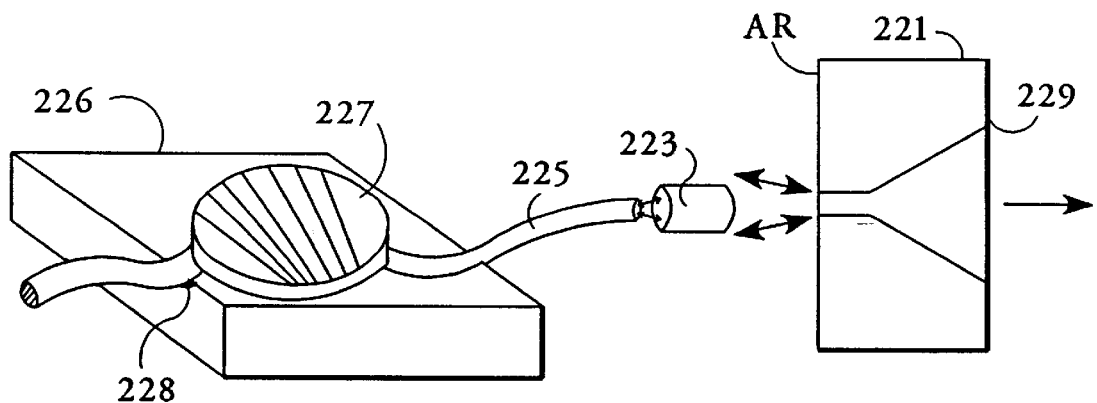

As seen in FIGS. 19 and 20, the amplifier chips 211 and 221 may be optically coupled to an external optical fiber 213 and 225. The optical fibers 213 and 225 are preferably single mode fibers. In FIG. 19, the fiber 213 is butted to the AR coated rear facet 214 of the amplifier chip 211 aligned with the position of the narrow single mode aperture of the flared gain region 212 of the amplifier chip 211. In FIG. 20, the fiber 225 is coupled via a lens 223 to receive the light emitted from amplifier chip 221 through the AR coated facet 224. Lens 223 may be a graded-index (GRIN) rod lens, as shown. In FIG. 19, feedback is provided by a highly reflective coating 215 on the far end of the optical fiber 213 so that a resonant cavity for laser oscillation is established between the reflective coating 215 and the low reflectivity front end facet 217 of the amplifier chip 211. In FIG. 20, frequency selective feedback is provided by a tunable Bragg grating reflector 227 associated with the optical fiber 225. The fiber 225 might be held in a groove 228 formed in a support 226 and the grating reflector 227 placed over the fiber 225 on the support 226. The end of the fiber 225 beyond the grating reflector 227 can be cleaved at an angle to minimize feedback from end reflections. The grating reflector 227 has a refractive index which is higher than the fiber's cladding so that coupling of light is via the evanescent wave leaking out of the cladding into the grating reflector 227 above it. The fiber cladding may need to be thinned in this region for adequate coupling to occur. If the grating teeth are arranged in a fan shape, as shown, tuning can take place by sliding the reflector 227 from side-to-side to adjust the grating pitch in the vicinity of the fiber 225. W. Sorin, et al. reported in *Optics Letters*, Vol. 13, No. 9, pages 731–733 (1988) that a laser diode coupled to such an external fiber cavity is stepwise tunable over about a 66 nm range. In combination with our amplifier chip 221 with flared gain region 222, the fiber coupled laser achieves stable, high power single frequency operation with a narrow line-width. A grating could also be formed within the optical fiber itself and be tunable by applying stress to the fiber in the grating region.

Figure 21:
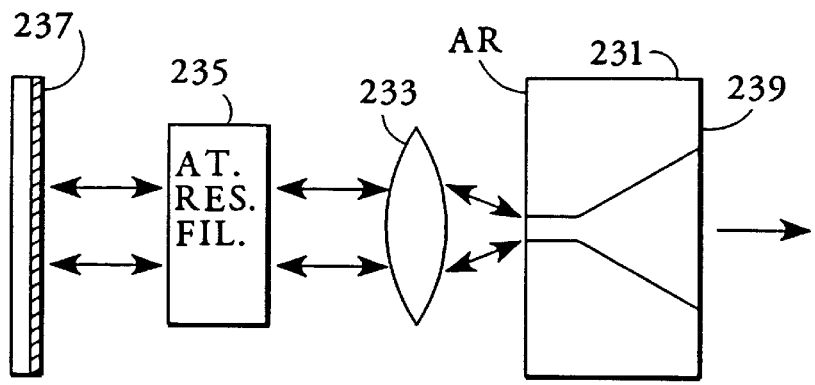

In FIG. 21, an atomic resonance filter 235 is incorporated into the external cavity. The arrangement is similar to that shown in FIG. 18, but with the atomic resonance filter 235 replacing the saturable absorber 205. The cavity is defined by an external rear reflector 237, such as a mirror or grating, and a low reflectivity front end facet 239 of an amplifier chip 231. The amplifier chip 231 may be any of those shown in FIGS. 6A–6H, 7, 9, 11, 12, 13, 15, 16, 17, 24, 25, 26, 28 and 37 described herein. A lens 233 between the amplifier chip 231 and the atomic resonance filter 235 collimates light received from the amplifier chip 231 and focuses return light reflected from the rear reflector 237 so as to couple the light back into the amplifier chip 231. The resulting laser produces a stable, single frequency output 240 having a frequency that is referenced to an atomic resonance frequency specified by the filter 235.

Figure 22:
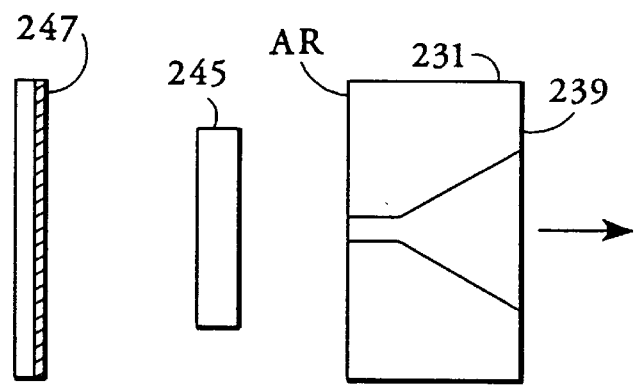

In FIG. 22, the external resonant cavity, defined by an external rear reflector 247 and a low reflectivity front end facet 249 of an amplifier chip 241 with flared gain region 242, includes a birefringence filter 245 for wavelength selection. Such a birefringence filter 245 could be tunable. For example, as described by A. Schremer, et al. in *Applied Physics Letters* 55(1), pages 19–21 (1989), an electro-optic birefringent modulator can be placed in external cavities for wavelength tuning. Frequency modulation of the laser output could also be performed using such a configuration. The amplifier chip 241 with flared gain region 242 of the present invention ensures high power, single spatial mode outputs as the frequency is tuned or modulated.

Figure 23:
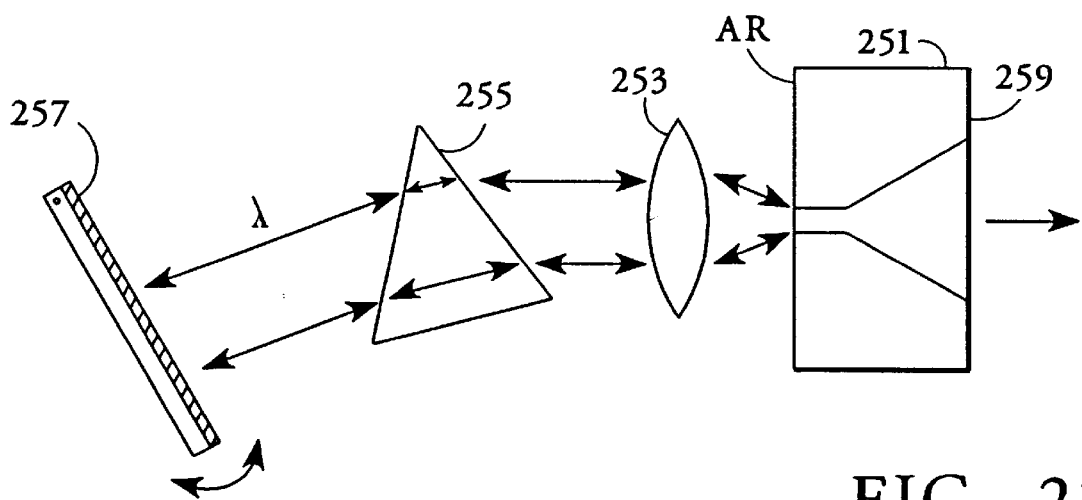

In FIG. 23, instead of the rear grating reflector 15 of FIG. 1, a prism 255 and a mirror 257 could be used to provide wavelength selective feedback in the external cavity and to obtain a frequency tunable output. An amplifier chip 251 has a flared gain region 252, as in FIGS. 2A–2D. A rear end facet 254 is antireflection coated to prevent self-oscillation, while a front end facet 259 has low reflectivity. Together, the external mirror 257 and front end facet 259 define a resonant optical cavity for laser oscillation. A lens 253 receives and collimates light emitted from the narrow aperture end of the flared gain region 252 at the AR coated facet 254. A prism 255 is positioned between the lens 253 and mirror 257 and oriented for refracting the collimated beam received from lens 253. Preferably, prism 255 is made of a material, such as dense flint glass, that has high dispersion $|\Delta\lambda/\Delta\theta|$ in the wavelength band coinciding with the gain band of the amplifier chip 251. The orientation of the mirror 257 determines which wavelength of light will be incident perpendicular thereon and therefore which wavelength will be fed back into the gain region 252.

Figure 24A:
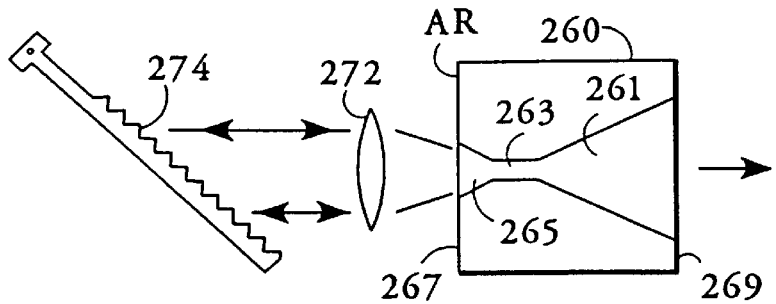
Figure 24B:
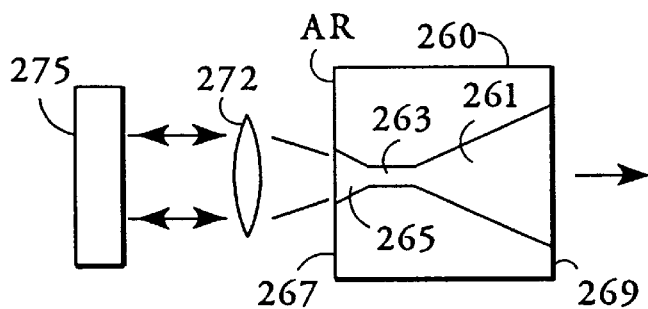

With reference to FIG. 24, the single mode waveguide 263 serving as a spatial mode filter in amplifier chip 260 need not extend all of the way to the antireflection (AR) coated intracavity rear facet 267. Rather, a short flared region 265 could be provided in the amplifier chip 260 between the single mode waveguide 263 and the rear facet 267. As in previous laser embodiments, the resonant cavity is defined between an external rear grating reflector 274 and a low reflectivity front facet 269 of the amplifier chip 269. In operation, light that has the particular wavelength to be reflected by the grating reflector 274 back onto its incident light path will be focussed by lens or lens system 272 through the rear facet 267 into the short flared region 265. The short flared region 265 tapers down to the single mode waveguide 263 at a rate that allows the light to be efficiently coupled into the waveguide 263. Forward propagating light emerging from the single mode waveguide 263 is then allowed to freely diffract and diverge in the principal flared gain 261 of the amplifier chip 260, in which the optical power is increased to high levels at the output facet 269.

Figure 25A:
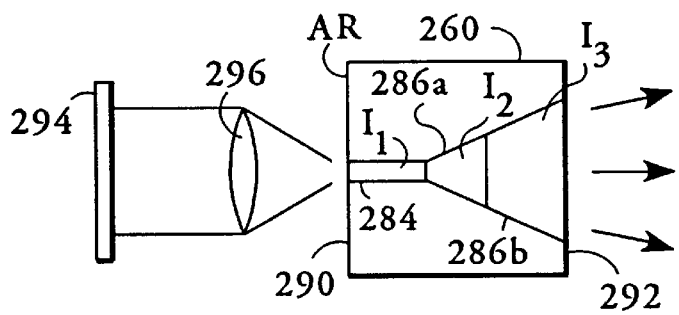
FIGS. 25A and 25B are respective top and side plan views of a wavelength unable, external cavity, semiconductor laser of the present invention with differential pumping.
Figure 25B:
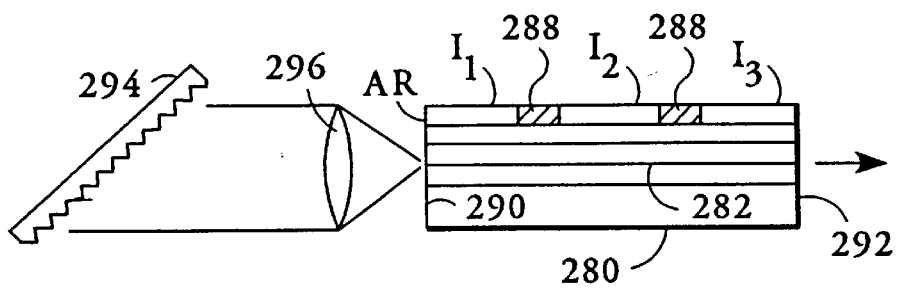

With reference to FIGS. 25A and 25B, a light amplifying diode heterostructure 280 with a pn rectifying junction 282 for providing an active region for amplification of lightwaves has a single mode waveguide section 284 for guiding propagation of the lightwaves and a two-part flared gain section 286a and 286b in which the lightwaves are allowed to freely diverge as they are amplified. In this embodiment, proton surface implants 288 electrically isolate the respective waveguide section 284 and flared gain section parts 286a and 286b so that each isolated part can be separately pumped with a different amount of electric current $I_1$, $I_2$ and $I_3$. Other electrical isolation techniques, such as selective surface etching, could be used in place of proton surface implants 288 to provide the isolation. Separate conductive surface contacts for each region apply the different current levels $I_1$, $I_2$ and $I_3$ to the respective regions. Current $I_1$ applied to single mode waveguide 284 may be adjusted to optimally excite the narrow aperture end of flared gain region 286a and/or can be modulated to modulate the laser output. Current $I_2$ applied to the narrower rear part 286a of the flared gain region may be lower than the current $I_3$ applied to the broader part 286b in order to minimize amplification of signal noise and to suppress the formation of filaments. Current $I_2$ could also be modulated to modulate the laser output. The laser's resonant cavity is again defined by an external rear grating reflector 294 for frequency tunability and by a low reflectivity front output facet 292 of the amplifier chip 280. Alternatively, the grating reflector 294 may be replaced by a plane mirror. In this case, multiple longitudinal mode operation is possible and mode locking of the output can be achieved by modulation of at least a portion of the single mode waveguide 284 (or other regions) with a current at a frequency of c/2nL, where c/n is the speed of light in the cavity and L is the cavity length. Also, note that passive mode locking could also be used. A reverse bias section of waveguide 284 could provide a saturable absorbing region, for example. Further, note that mode locking is possible, if external reflector 294 were replaced by a reflective surface for facet 290, thus making the device entirely monolithic. A lens or lens system 296 collimates light emitted from the single mode waveguide 284 through antireflection coated rear facet 290 for reflection by the grating 294 and focuses the light reflected by the grating 294 back onto rear facet 290 for coupling into waveguide 284.

Figure 26:
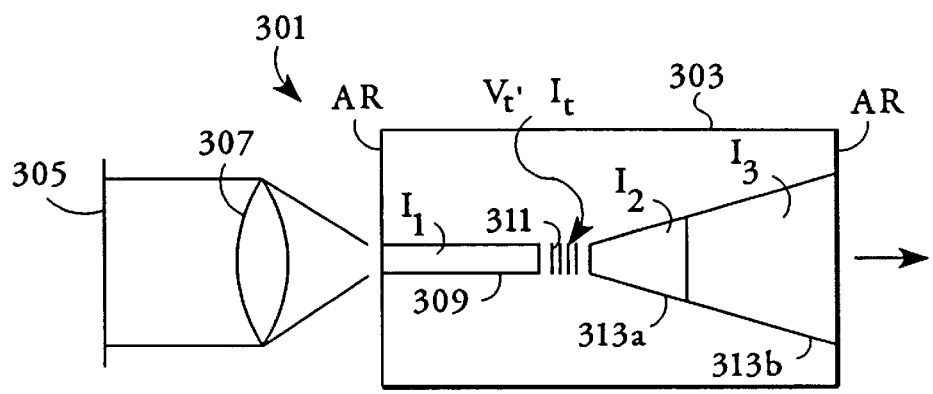
FIG. 26 is a schematic top plan view of an external cavity MOPA embodiment of the present invention with a tunable grating integrated on the amplifier chip of the MOPA device.

With reference to FIG. 26, a MOPA device 301 includes an amplifier chip 303 with antireflection (AR) coated end facets, an external rear reflector 305 and a collimating and focusing lens 307. The amplifier chip 303 includes a single mode waveguide section 309 to which a first current $I_1$ is applied, distributed Bragg reflector (DBR) grating 311 at an end of the waveguide 309 to which a tuning current $I_t$ or a tuning bias voltage $V_t$ may be applied, and a two-part flared amplifier section 313a and 313b optically coupled via the grating 311 to the waveguide 309 to which respecting amplifying currents I2 and I3 can be applied. The resonant optical cavity of the MOPA's laser oscillator is defined by external rear reflector 305 and the wavelength tunable grating 311 integrated in the chip 303. This embodiment, thus, can tune the wavelength of the MOPA device's light output beam by changing the tuning bias $V_t$ or current $I_t$ that is applied to the integral DBR grating 311. In operation, wavelength tuning may or may not be desired. Currents $I_2$ and $I^3$ may be differentially pumped with a lower current density under $I_2$ to provide high coherent output power. A different series resistance in these regions could provide the same benefit. Tailoring the chip's internal resistance, as in FIG. 6E, could allow $I_1$, $I_2$ and $I_3$ to all be driven from the same electrical contact. Current $I_1$ may also be used for phase control tuning between mirror 305 and grating 311.

Each of the above-described lasers and MOPA devices is characterized by a light amplifying diode heterostructure or amplifier chip with a flared gain region that allows light propagating therein to freely diffract. In the lasers of the present invention, the diverging light which is partially reflected by the low reflectivity front end facet continues to diverge, so that only the central rays pass through the narrow aperture end of the flared gain region and through the antireflection coated rear facet of the amplifier chip to the external rear reflector of the resonant cavity. Effectively, the cavity acts as a marginally stable resonator with a single mode spatial filter that ensures a single spatial mode of oscillation. The light output from the broad front end of the flared gain region is characterized by high powers (in excess of 1 W cw) and good modal quality. Embodiments with frequency selective elements in the external cavity are tunable over a bandwidth of at least 50 nm and provide stable, single frequency and narrow linewidth outputs even at high output power levels.

Figure 27:
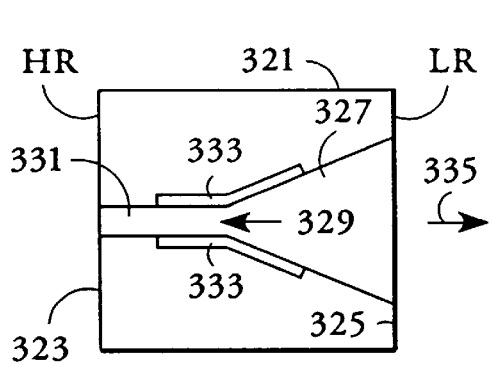
FIGS. 27–32 are top plan views of additional semiconductor lasers of the present invention with an integral spatial mode filter and integral cavity reflectors.

With reference to FIG. 27, a laser made up of a light amplifying semiconductor diode heterostructure 321 includes a pair of reflection cleaved end facets 323 and 325 integral with the heterostructure 321 for providing feedback of light and for defining an optical resonant cavity for laser oscillation. The heterostructure 321 has a multimode gain region 327, preferably flared, permitting the propagation of light therein with a diverging phase front. The flared gain region 327 has a single spatial mode light aperture 329 at a narrow end of the flared gain region 327. The aperture 329 preferably comprises a single mode waveguide section 331 in the diode heterostructure 321 optically coupled at one end to the flared gain region 327. The opposite end of the waveguide 331 terminates in the rear end facet 323, which is preferably coated for high reflectivity. The front end facet 325 at the broad end of the flared gain region 327 furthest from the single mode aperture 329 has a low reflectivity of at least about 0.5%, but preferably not more than about 5%. A reflectivity of about 1% is typical. The diverging light that is reflected by front end facet 325 continues to diverge. Only the central-most rays couple through the narrow aperture 329 into the waveguide 331 to be reflected by the rear facet 323. Lossy regions 333 may be provided at the side edges of the waveguide 331 and gain region 327 near the aperture 329 in order to suppress oscillation of any light that could be coupled out of the gain region 327 into other portions of the diode heterostructure 321 other than through the light aperture 329. The lossy regions 333 may be low bandgap absorption regions formed by impurity induced disordering or implantation or by epitaxial growth of different levels or heights, such as by growth upon a terraced or channeled substrate. Alternatively, the top heterostructure layers could be etched away in these regions 333 down through the active layer or layers. Laser light 335 is emitted through the low reflectivity front end facet 335, where it could be collimated by an external lens system, not shown.

Figure 28:
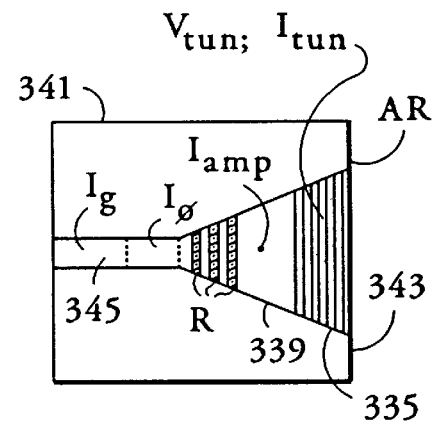
Figure 29:
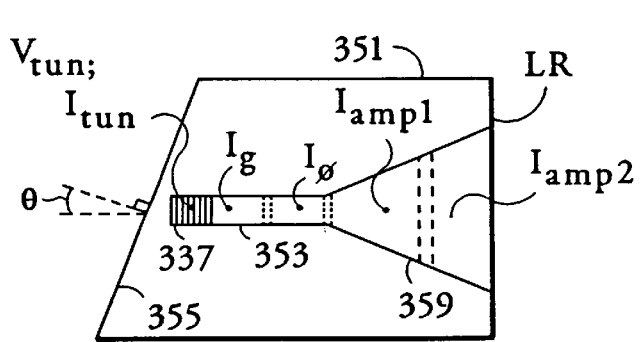

Referring now to FIGS. 28 and 29, one of the reflective cleaved end facets 323 or 325 of FIG. 27 may be replaced by a grating reflector 335 or 337 at one end of the diode heterostructure 341 or 351. In FIG. 28, the grating reflector 335 is located at the broad end of the flared gain region 339. The end facet 343 adjacent to grating reflector 335 is antireflection coated to suppress Fabry-Perot cavity modes. Differential pumping of flared gain region 339 is provided by creating resistive regions R by ion implantation or other means. In FIG. 29, the grating reflector 337 is located at the rear end of single mode waveguide section 353. The rear end facet 355 proximate to grating reflector 337 may be oriented at a nonperpendicular angle θ relative to the principal direction of light propagation in waveguide section 353 and flared gain region 357 in order to suppress reflection from this surface. The grating reflectors 335 and 337 provide single frequency reflection of lightwaves in the resonant cavity and can be tuned by a bias voltage $V_{tun}$ or tuning current $I_{tun}$ applied to a conductive contact above the gratings 335 and 337 so as to adjust the wavelength reflection response of the gratings 335 and 337. In addition to a pump current $I_g$ applied to single mode waveguide sections 345 and 353, a separate phasing current $I_\phi$ may also be applied to an area of the waveguide sections 345 and 353 to adjust the optical path length of the resonant cavity to match the phase of the light propagating in the cavity to the selected wavelength. This enables continuous wavelength tuning by adjusting the tuning voltage or current $V_{tun}$ or $I_{tun}$ and the phasing current $I_\phi$ in concert to prevent or minimize longitudinal mode hopping as tuning takes place. The flared gain regions 339 and 359 can be differentially pumped along their lengths either by applying a single amplification current $I_{amp}$ and providing surface resistive regions R in the narrower area of the gain region 339, as in FIG. 28, or by applying separate amplification currents $I_{amp1}$ and $I_{amp2}$ to respective narrower and broader areas of the flared gain region 357, as seen in FIG. 29.

Figure 30:
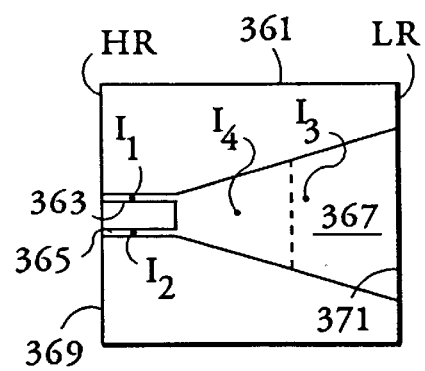

With reference to FIG. 30, a flared laser oscillator 361 includes two single spatial mode waveguide sections 363 and 365 connected to a narrow end of a common flared gain region 367. The resonant cavity is defined between reflective cleaved end facets 369 and 371. Wavelength tuning and far field beam steering can be accomplished by changing the current $I_1$ and $I_2$ applied to the waveguide sections 363 and 365. If different currents $I_1$ and $I_2$ are applied simultaneously, the laser output is of tunable wavelength. As in previous embodiments the flared gain region 367 can be differentially pumped along its length with separate applied currents $I_3$ and $I_4$.

Figure 31:
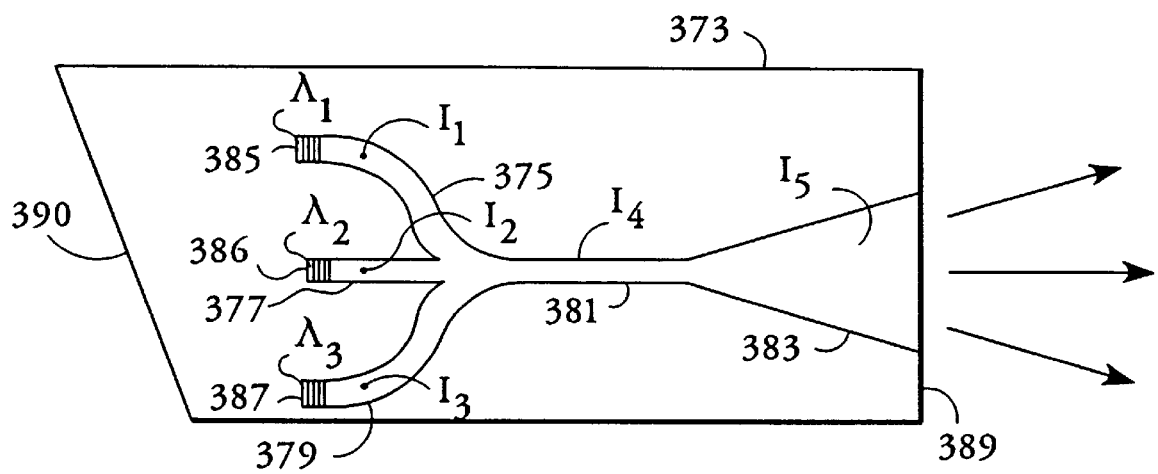

Referring to FIG. 31, another flared laser oscillator 373 also has multiple single mode waveguide sections 375, 377 and 379 feeding through a single mode combining section 381 to a common flared gain region 383. However, grating reflectors 385–387 having grating pitches $\Lambda_1$, $\Lambda_2$ and $\Lambda_3$ and placed in the light path, here at the rear ends of the single mode waveguide sections 375, 377 and 379, are used to select the wavelengths of the laser output. The resonant cavity is defined by the gratings 385–387 and the low reflectivity front end facet 389. The rear facet 390 may be oriented at a nonperpendicular angle to the direction of light propagation in order to suppress possible Fabry-Perot modes of oscillation. Different currents $I_1$–$I_5$ may be applied to respective sections 375, 377, 379, 381 and 383. Excitation of the various sections with currents of $I_1$, $I_2$ or $I_3$ also results in discrete switching of output wavelengths.

We claim:

1. A semiconductor gain medium comprising:
   a light divergence region having an input end of narrower lateral divergence width and output end of wider lateral divergence width for permitting divergence of light propagating from the input end to the output end; and
   a plurality of resistive regions R formed in a region within the light diverging region at the narrow input end thereof.

2. The semiconductor gain medium of claim 1 wherein said resistive regions comprise a pattern of resistive stripes extending in a direction transverse to the direction of light propagation in said light diverging region.

3. The semiconductor gain medium of claim 1 wherein said gain medium is a laser, amplifier, master oscillator power amplifier or an unstable resonator.

4. The semiconductor gain medium of claim 1 wherein said light diverging region is a flared amplifier region.

5. The semiconductor gain medium of claim 1 wherein said gain medium is an amplifier.

6. The semiconductor gain medium of claim 1 wherein said gain medium includes an amplifier, laser, master oscillator power amplifier or an unstable resonator.

7. The semiconductor gain medium of claim 1 wherein said gain medium includes an optical resonant cavity.

8. The semiconductor gain medium of claim 1 further comprising means to provide optical feedback to at least a portion of said gain medium.

9. The semiconductor gain medium of claim 1 wherein said gain region includes a single mode waveguide region and a diverging amplifier region comprising said light divergence region, said input end of said diverging amplifier region optically coupled to one end of said single mode waveguide region.

10. The semiconductor gain medium of claim 1 wherein said resistive regions in said light diverging region form a plurality of pumped regions spatially position in a direction of propagating radiation.

11. The semiconductor gain medium of claim 10 wherein said pumped regions comprise a plurality of pumped stripe regions.

12. The semiconductor gain medium of claim 10 wherein a remaining portion of said light diverging region comprises single uniformly pumped gain region.

13. The semiconductor gain medium of claim 12 wherein said light diverging region remaining portion is pumped via a single contact with said pumped stripe regions so that differential pumping is achieved.

14. The semiconductor gain medium of claim 12 wherein said remaining portion is a remainder of all of said light diverging region except for said resistive regions.

15. The semiconductor gain medium of claim 1 wherein said resistive regions are created by ion implantation.

* * * * *